United States Patent
Lee et al.

(10) Patent No.: US 9,786,624 B2
(45) Date of Patent: Oct. 10, 2017

(54) SEMICONDUCTOR PACKAGE

(71) Applicant: Samsung Electronics Co., Ltd., Suwon-si (KR)

(72) Inventors: Jae-chan Lee, Yongin-si (KR); Chang-yong Park, Cheonan-si (KR); Hun Han, Asan-si (KR); Jae-hoon Choi, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/222,155

(22) Filed: Jul. 28, 2016

(65) Prior Publication Data
US 2017/0084511 A1 Mar. 23, 2017

(30) Foreign Application Priority Data

Sep. 17, 2015 (KR) .......................... 10-2015-0131536

(51) Int. Cl.
- *H01L 23/13* (2006.01)
- *H01L 21/56* (2006.01)
- *H01L 23/00* (2006.01)

(52) U.S. Cl.
CPC ............ *H01L 24/17* (2013.01); *H01L 21/563* (2013.01); *H01L 23/13* (2013.01)

(58) Field of Classification Search
CPC .......... H01L 23/12–23/13; H01L 23/36; H01L 23/295; H01L 23/3157; H01L 23/49811; H01L 24/17; H01L 21/563

See application file for complete search history.

(56) References Cited

U.S. PATENT DOCUMENTS

| | | | |
|---|---|---|---|
| 8,426,959 B2 | 4/2013 | Park et al. | |
| 8,709,879 B2 | 4/2014 | Park et al. | |
| 8,772,083 B2 | 7/2014 | Leung et al. | |
| 2006/0086944 A1* | 4/2006 | Wu ........................... | B41J 2/45 257/99 |
| 2011/0222256 A1 | 9/2011 | Topacio | |
| 2013/0062786 A1 | 3/2013 | Leung et al. | |
| 2015/0001733 A1* | 1/2015 | Karhade ............... | H01L 23/538 257/774 |
| 2016/0322274 A1* | 11/2016 | Takizawa ................ | H01L 23/12 |

FOREIGN PATENT DOCUMENTS

| | | |
|---|---|---|
| KR | 100484890 | 4/2005 |
| KR | 100994099 | 11/2010 |
| KR | 101216850 | 12/2010 |
| KR | 20110019321 | 2/2011 |
| KR | 101056404 | 8/2011 |
| KR | 101138469 | 4/2012 |
| KR | 20130037204 | 4/2013 |
| KR | 20140066706 | 6/2014 |
| KR | 20140132531 | 11/2014 |

* cited by examiner

Primary Examiner — Christine Enad
(74) Attorney, Agent, or Firm — Onello & Mello, LLP.

(57) ABSTRACT

A semiconductor package includes a substrate having a groove in an upper surface. A semiconductor device is mounted on the substrate to cover one portion of the groove and leaving another portion exposed.

20 Claims, 26 Drawing Sheets

SEMICONDUCTOR PACKAGE

CROSS-REFERENCE TO RELATED APPLICATION

This application claims the benefit of Korean Patent Application No. 10-2015-0131536, filed on Sep. 17, 2015, in the Korean Intellectual Property Office, the disclosure of which is incorporated herein in its entirety by reference.

BACKGROUND

Inventive concepts relate to a semiconductor package, and more particularly, to a substrate included in a semiconductor package and an underfill material layer provided on the substrate.

A semiconductor package may be configured by connecting a semiconductor device onto a substrate via conductive bonding units. An underfill material layer may be formed between the substrate and the semiconductor device in order to absorb mechanical stress applied to the conductive bonding units.

SUMMARY

In example embodiments in accordance with principles of inventive concepts a semiconductor package includes a substrate that allows easy forming of an underfill material layer between the substrate and a semiconductor device.

In example embodiments in accordance with principles of inventive concepts, there is provided a semiconductor package including a substrate having at least one groove in an upper surface; and a semiconductor device mounted on the substrate, wherein the at least one groove has a shape including a first region and second region that are connected to each other. The first region may be covered by the semiconductor device and the second region may be uncovered by the semiconductor device.

In example embodiments in accordance with principles of inventive concepts a semiconductor package may further include: an underfill material layer filling the first region and the second region and formed between the substrate and the semiconductor device.

In example embodiments in accordance with principles of inventive concepts underfill material layer may be fully filled between the substrate and the semiconductor device.

In example embodiments in accordance with principles of inventive concepts underfill material layer may include: a plurality of underfill members spaced apart from each other, wherein the at least one groove include a plurality of grooves which are respectively filled by the plurality of underfill members.

In example embodiments in accordance with principles of inventive concepts the at least one groove may include two first sides divided into the first region and the second region and two second sides, each included in one of the first region and the second region, wherein the first sides are longer than the second sides.

In example embodiments in accordance with principles of inventive concepts one of the two second sides may be in the second region and the other one may be in the first region.

In example embodiments in accordance with principles of inventive concepts two second sides may be parallel to each other in the second region.

In example embodiments in accordance with principles of inventive concepts the second sides may be equal to or less than one half the length of the first sides.

In example embodiments in accordance with principles of inventive concepts the two first sides may not be parallel to each other.

In example embodiments in accordance with principles of inventive concepts a space between the two first sides may taper from the second region to the first region.

In example embodiments in accordance with principles of inventive concepts lower or side surfaces of the groove may be inclined.

In example embodiments in accordance with principles of inventive concepts the lower surfaces of the groove may be deeper in the second region than in the first region.

In example embodiments in accordance with principles of inventive concepts the substrate may include a wiring layer and a solder resist layer, wherein the groove are formed by etching a part of the solder resist layer.

In example embodiments in accordance with principles of inventive concepts a semiconductor package including a substrate having at least one groove in an upper surface; a semiconductor device mounted on the substrate and exposing a portion of the groove and covering the remaining portion of the grooves; and an underfill material layer filling the exposed portion and the remaining portion of the groove and formed between the substrate and the semiconductor device.

In example embodiments in accordance with principles of inventive concepts a part of the underfill material layer that fills the exposed portion and the remaining portion of the groove and another part formed between the substrate and the semiconductor device may be integrally formed with each other.

In example embodiments in accordance with principles of inventive concepts a semiconductor package includes a substrate including a printed circuit board and a solder resist layer coated on a top surface thereof; a groove formed in the solder resist layer; and a semiconductor device mounted on the top surface of the substrate, leaving a portion of the groove exposed.

In example embodiments in accordance with principles of inventive concepts a semiconductor package includes an underfill material between the semiconductor device and substrate and at least partially filling the groove.

In example embodiments in accordance with principles of inventive concepts a semiconductor package includes the semiconductor device including a second semiconductor package.

In example embodiments in accordance with principles of inventive concepts a semiconductor package includes underfill material that is in areas between the semiconductor device and the substrate in addition to that in the groove.

In example embodiments in accordance with principles of inventive concepts a semiconductor package includes a groove that is narrower under the semiconductor device than outside the boundary of the semiconductor device.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1A:
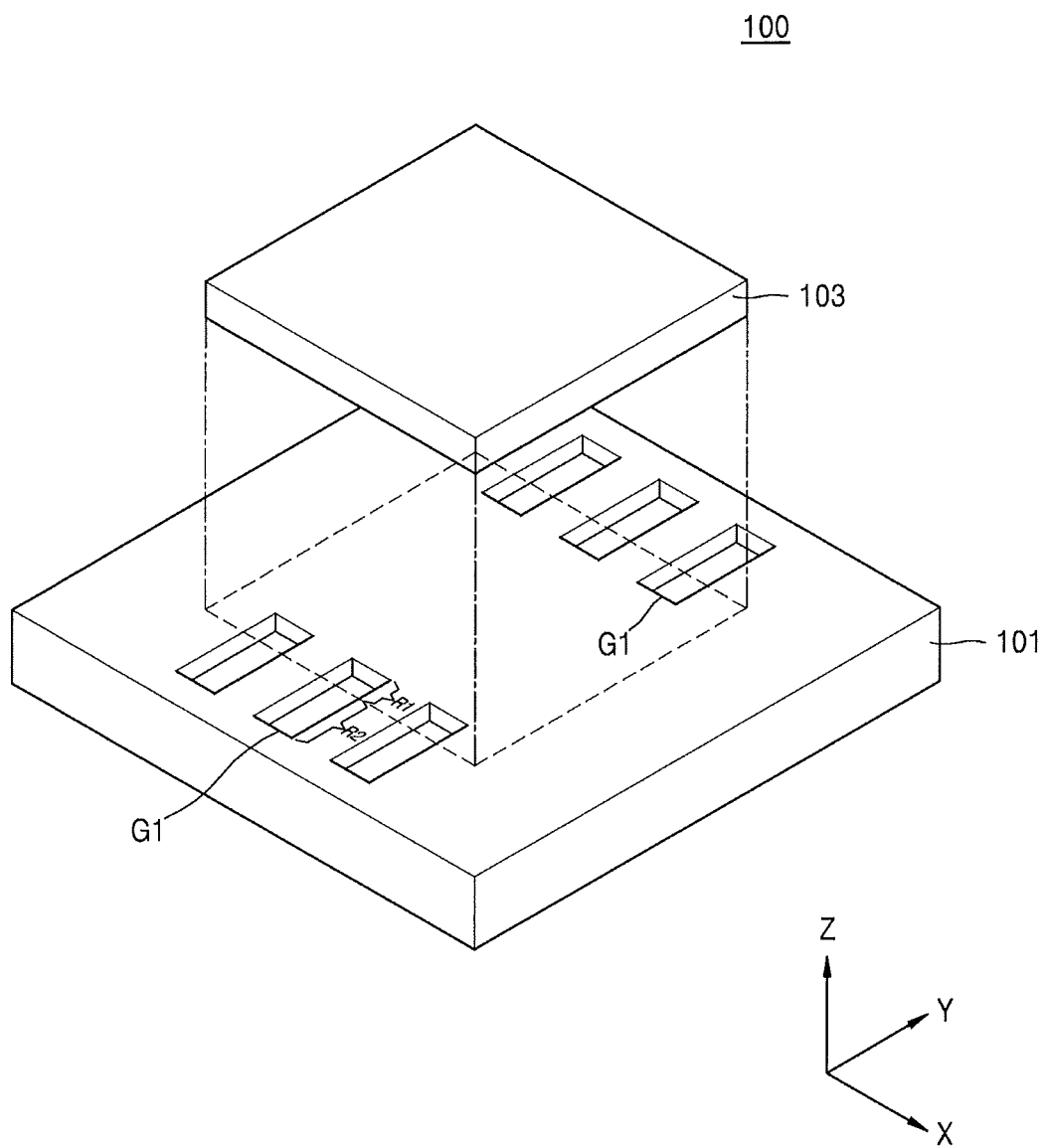
FIGS. 1A through 1D are exploded perspective, plan, and cross-sectional views of a semiconductor package according to example embodiments.

Inventive concepts will now be described more fully hereinafter with reference to the accompanying drawings, in which example embodiments of the inventive concept are shown. Inventive concepts may, however, be embodied in different forms and should not be construed as limited to the embodiments set forth herein. Rather, these embodiments are provided so that this disclosure is thorough and complete and fully conveys teachings of the inventive concept to one skilled in the art. Like reference numerals in the drawings denote like elements, and thus their description will not be repeated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

When some embodiments may be embodied otherwise, respective process steps described herein may be performed otherwise. For example, two process steps described in a sequential order may be performed at substantially the same time or in reverse order.

Variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing.

Figure 1B:
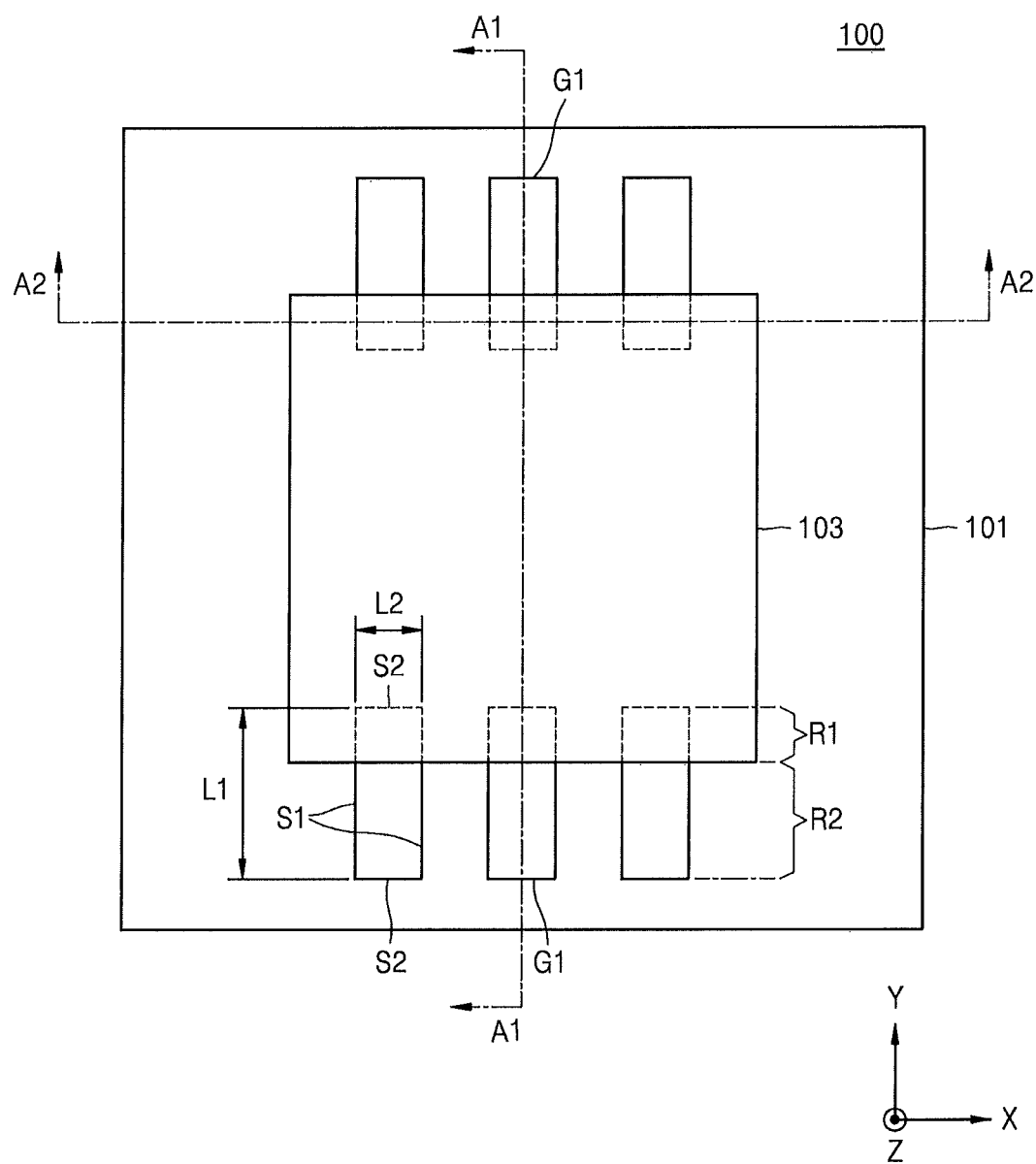
Figure 1C:
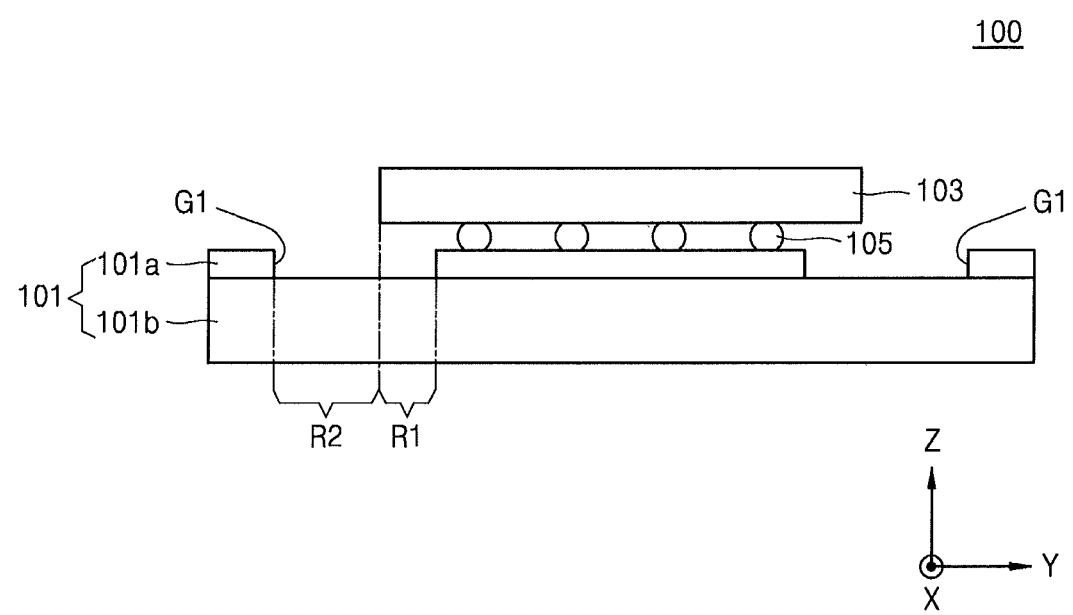
Figure 1D:
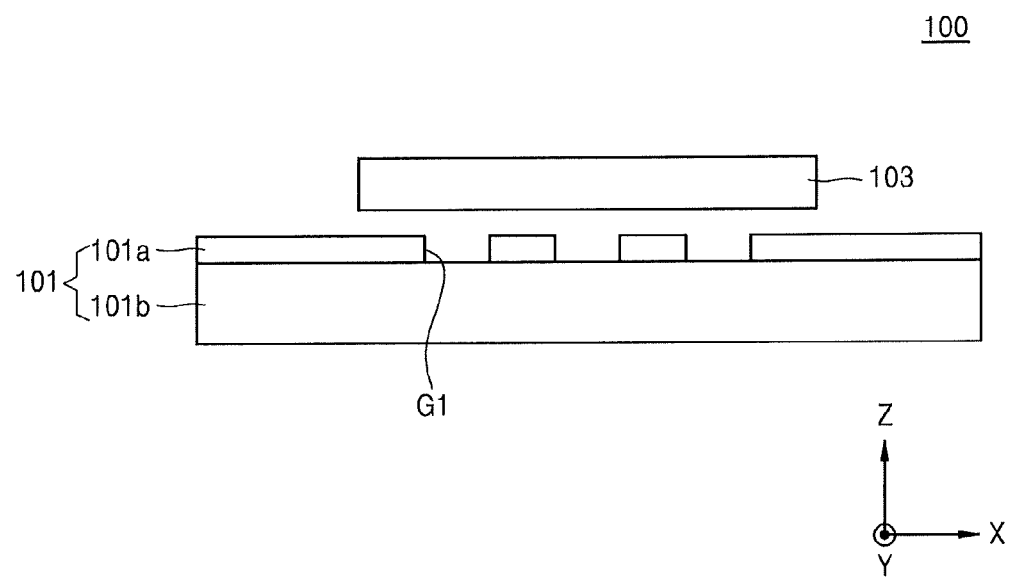

FIGS. 1A through 1D are exploded perspective, plan, and cross-sectional views of a semiconductor package 100 according to example embodiments. FIG. 1C is a cross-sectional view taken along line A1-A1 of FIG. 1B. FIG. 1D is a cross-sectional view taken along line A2-A2 of FIG. 1B.

Referring to FIGS. 1A and 1B, the semiconductor package 100 may include a substrate 101 including grooves G1 in an upper surface thereof and a semiconductor device 103 mounted on the substrate 101. The grooves G1 may be delineated by connecting a first region R1 that overlaps the semiconductor device 103 and a second region R2 that does not overlap the semiconductor device 103. That is, the grooves G1 may extend from the second region R2 having an open upper surface to the first region R1 having an upper surface hidden by the semiconductor device 103 when semiconductor device 103 is mounted on substrate 101.

The semiconductor device 103 may be connected onto the substrate 101 through a plurality of conductive bonding units 105. An underfill material layer (not shown) may be filled between the substrate 101 and the semiconductor device 103 and between the plurality of conductive bonding units 105. Because the space between the substrate 101 and the semiconductor device 103 may be very narrow, the underfill material layer (not shown) may not be easily formed. However, in accordance with principles of inventive concepts, if the second region R2 of the grooves G1 is coated with an underfill material, the underfill material may be easily filled between the substrate 101 and the semiconductor device 103 along the grooves G1.

In general, the underfill material may be moved along a flat surface of the substrate 101. Because adhesion between the underfill material and a surface of the substrate 101 may be weaker than cohesion of the underfill material, the underfill material may be difficult to move. Accordingly, the underfill material may not be filled between the substrate 101 and the semiconductor device 103 and may be harden at an edge location.

According to inventive concepts, because the underfill material has adhesion over a wide area along a lower surface of the grooves G1 and both sides thereof; the adhesion of the underfill may be stronger than the cohesion of the underfill material. Accordingly, the underfill material coated on the second region R2 of the grooves G1 may be easily moved to the first region R1 and thus form the underfill material layer between the substrate 101 and the semiconductor device 103.

The term "underfill material layer" may include all arbitrary material layers filled between the substrate 101 and the semiconductor device 103. The underfill material layer may be included in a molding material formed to cover both side and upper surfaces of the semiconductor device 103 while filling between the substrate 101 and the semiconductor device 103. For example, the underfill material layer may be formed through a molded underfill (MIF) process. In such embodiments, a material filled between the substrate 101 and the semiconductor device 103 and a material covering an outside of the semiconductor device 103 may be the same. A detailed description of the underfill material layer will be provided later with reference to FIGS. 2A through 4B.

The substrate 101 may include a wiring layer 101b on which wiring patterns (not shown) are formed and a solder resist layer 101a limiting a bump pad (not shown) connected to the wiring patterns on the wiring layer 101b. The bump pad may be electrically connected to the conductive bonding units 105 supporting the semiconductor device 103 disposed on the substrate 101. The substrate 101 may be a printed circuit board (PCB) including the wiring patterns. The conductive bonding units 105 may be solder balls.

Each of the grooves G1 may be formed by partially etching the solder resist layer 101a. That is, the grooves G1 may be formed by being patterned on the solder resist layer 101a, for example.

The grooves G1 may each include two first sides S1 divided into the first and second regions R1 and R2 and two second sides S2, each included in one region of the first and second regions R1 and R2. A first length L1 of the first sides S1 may be a long side, and a second length L2 of the second sides S2 may be a short side. Accordingly, the grooves G1 may be a rail shape extending from the second region R2 having the open upper surface to the first region R1 having the upper surface hidden by the semiconductor device 103. In example embodiments, the second length L2 of the second sides S2 may be below a half of the first length L1 of the first sides S1. In accordance with principles of inventive concepts, flow of the underfill material moving along the grooves G1 may be controlled according to an aspect ratio of the first sides S1 and the second sides S2.

One of the second sides S2 of the grooves G1 may be disposed in the first region R1. Another one of the second sides S2 of the grooves G11 may be disposed in the second region R2. That is, the grooves G1 may not be formed to cross the entire region overlapped with the semiconductor device 103 in the substrate 101. That is, the grooves G1 may be formed in only a part of the region in which the substrate 101 and the semiconductor device 103 overlap. The grooves G1 may function to introduce the underfill material between the substrate 101 and the semiconductor device 103. In accordance with principles of inventive concepts, if the underfill material is introduced between the substrate 101 and the semiconductor device 103, because the narrow space between the substrate 101 and the semiconductor device 103 may function as a capillary, the underfill material may be easily filled into the entire region between the substrate 101 and the semiconductor device 103.

A total number of six grooves G1, three of which are formed in each side of the semiconductor device 103, are illustrated but inventive concepts are not limited thereto. At least one groove G1 may be formed but inventive concepts are not limited thereto.

The semiconductor device 103 may be a semiconductor chip or a semiconductor package. An electronic device may be configured by forming the semiconductor package 100 including a plurality of semiconductor devices 103 disposed on the substrate 101. For example, the semiconductor device 103 may be a memory chip such as DRAM (Dynamic Random Access Memory), SRAM (Static Random Access Memory), PRAM (Phase-change Random Access Memory), MRAM (Magnetoresistive Random Access Memory), FeRAM (Ferroelectric Random Access Memory), RRAM (Resistive Random Access Memory), NAND flash, NOR flash, or EEPROM (Electrically Erasable Programmable Read-only Memory), etc. or a memory package including the memory chip. The semiconductor device 103 may be a controller such as a microprocessor), a digital signal processor, a microcontroller, etc.

Figure 2A:
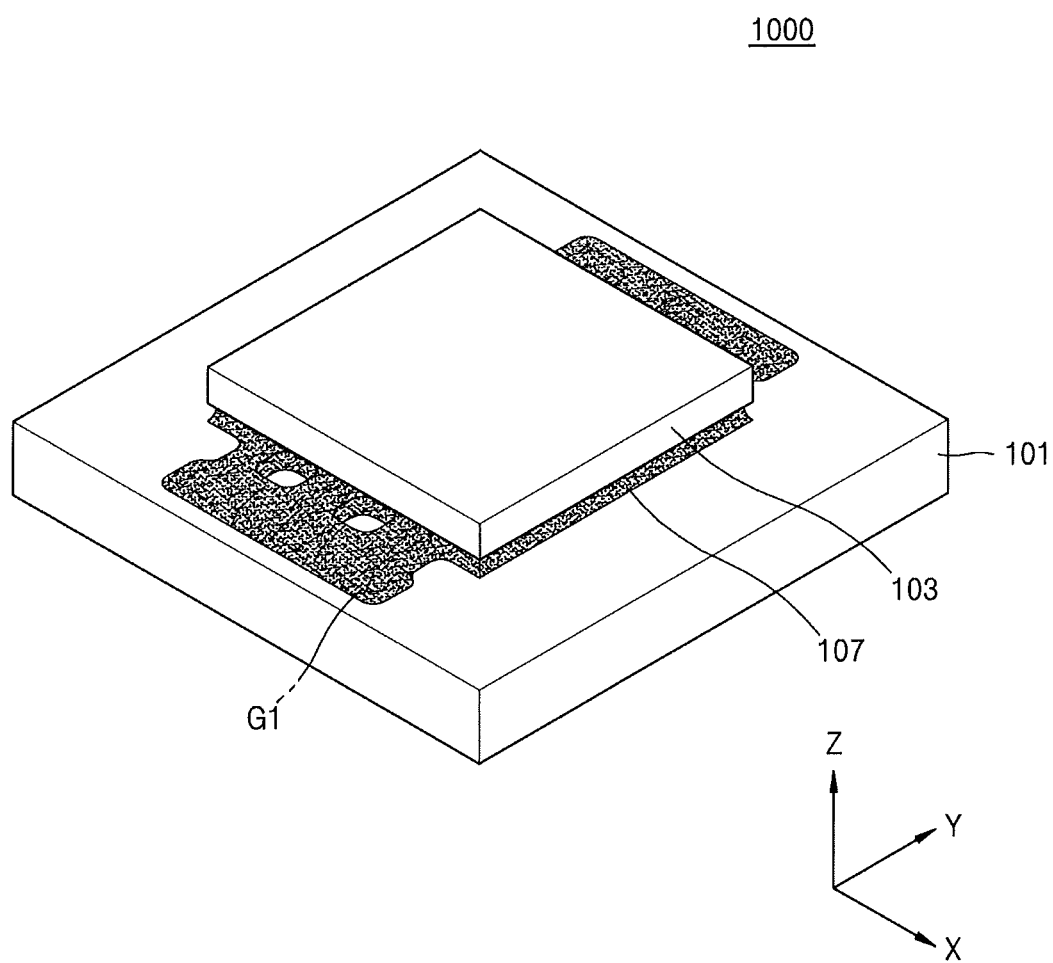
FIGS. 2A through 2D are perspective, plan, and cross-sectional views of a semiconductor package according to example embodiments.
Figure 2B:
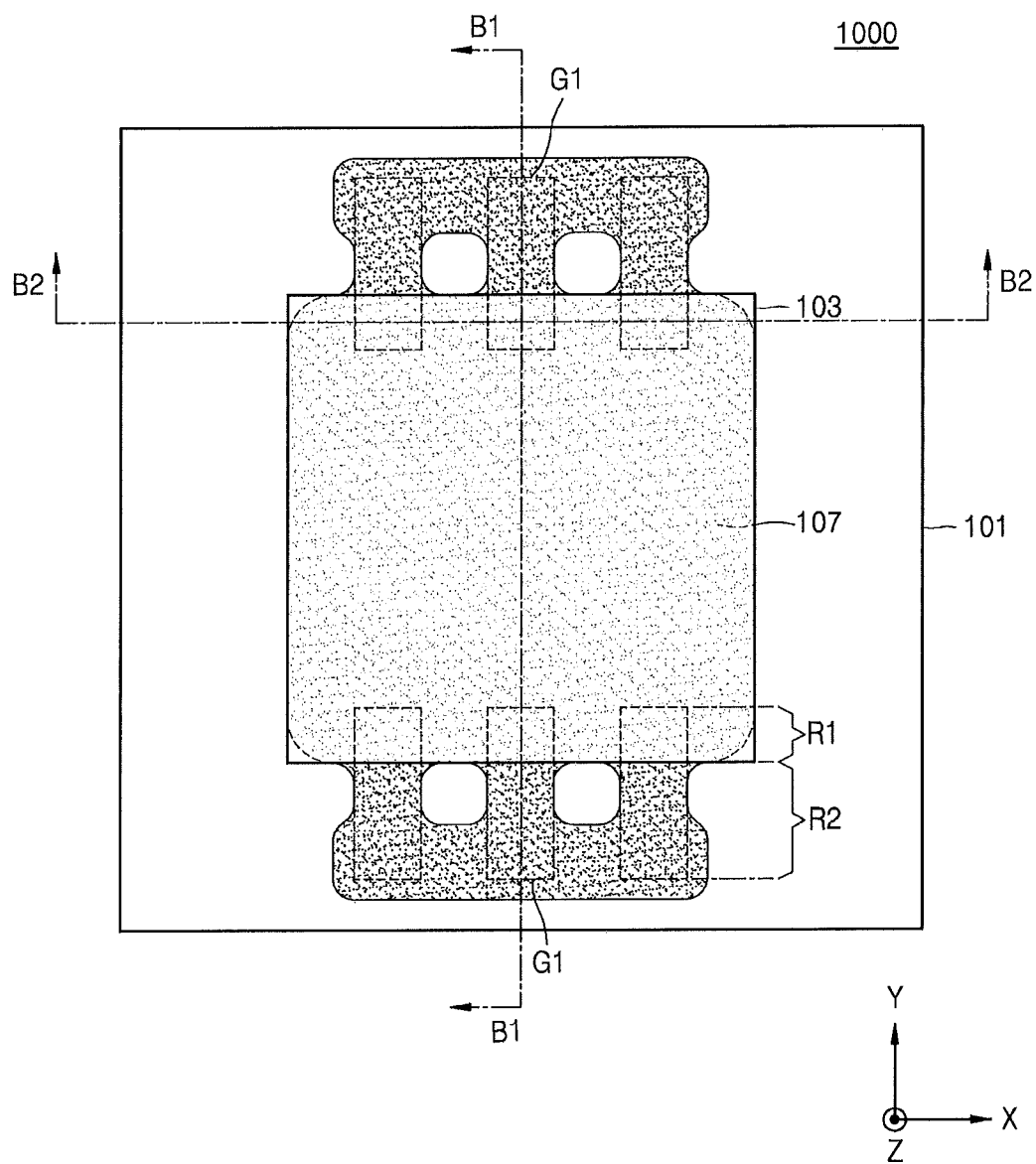
Figure 2C:
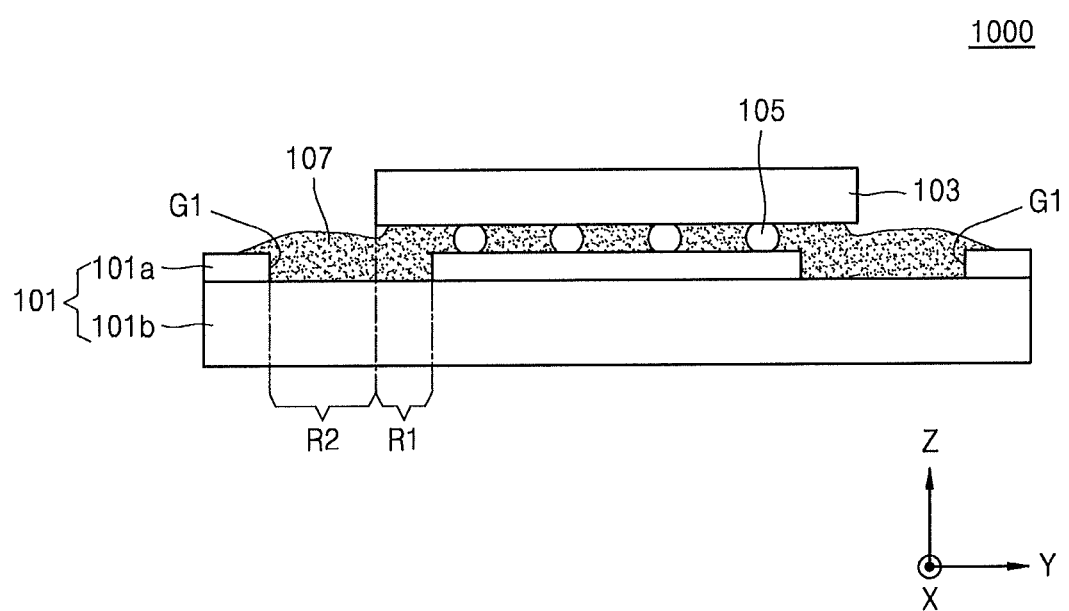
Figure 2D:
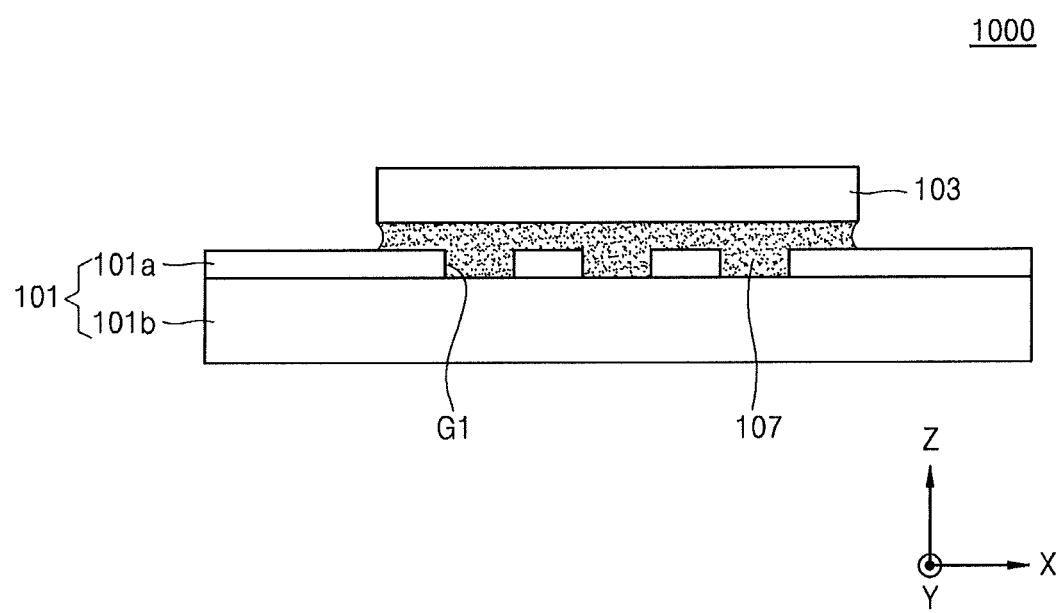

FIGS. 2A through 2D are perspective, plan, and cross-sectional views of a semiconductor package 1000 according to example embodiments. The semiconductor package 1000 is different from the semiconductor package 100 described with reference to FIGS. 1A through 1D above in that the semiconductor package 1000 further includes an underfill material layer 107. FIG. 2C is a cross-sectional view taken along line B1-B1 of FIG. 2B. FIG. 2D is a cross-sectional view taken along line B2-B2 of FIG. 2B. Like reference numerals between FIGS. 2A through 2D and FIGS. 1A through 1D denote like elements, and redundant descriptions thereof are provided in brief.

Referring to FIGS. 2A and 2B, the semiconductor package 1000 may include the substrate 101 including grooves G1 in an upper surface thereof, the semiconductor device 103 mounted on the substrate 101 to expose a part of the grooves G1 and cover a remaining part of the grooves G1, and the underfill material layer 107 formed between the substrate 101 and the semiconductor device 103 while filling the part under the semiconductor device 103 and the remaining part of the grooves G1.

The second region R2 may be an exposed upper region of the grooves G1. The first region R1 may be a non-exposed upper region of the grooves G1. A total number of six grooves G1 are formed, three of which are formed in each side of the semiconductor device 103. The six grooves G1 may be filled with the underfill material layer 107. The six groove G1 may function as a path for more easily moving an underfill material between the substrate 101 and the semiconductor device 103.

That is, the underfill material may be supplied to each of the six grooves G1 via the second region R2 and may be filled into the first region R1 based on adhesion with inner surfaces of the grooves G1. The underfill material may be moved to the first region R1 from the second region R2 based on the adhesion so that the underfill material may reach a narrow space between the substrate 101 and the semiconductor device 103. In accordance with principles of inventive concepts, underfill material may be filled between the substrate 101 and the semiconductor device 103 by using the adhesion with a surface of the substrate 101 and adhesion with a surface of the semiconductor device 103. That is, the narrow space between the substrate 101 and the semiconductor device 103 may function as a capillary, and thus the underfill material layer 107 may be formed in a region between the substrate 101 and the semiconductor device 103. Accordingly, a part of the underfill material layer 107 that fills the first region R1 and the second region R2 of the grooves G1 and a part of the underfill material layer 107 formed between the substrate 101 and the semiconductor device 103 may be integral.

When the underfill material is supplied to the second region, the underfill material may be continuously coated in the three grooves G1 formed in one side of the semiconductor device 103. Accordingly, the underfill material layer 107 filled in the three grooves G1 may have a connected shape in the second region R2 but inventive concepts are not limited thereto. In some embodiments, the underfill material layer 107 filled in the three grooves G1 may have a spaced shape in the second region R2. The underfill material layer 107 having the spaced shape in the second region R2 may be manufactured by separately coating the underfill material in the three grooves G1.

A range of the underfill material layer 107 formed between the substrate 101 and the semiconductor device 103 may be controlled according to an amount of the underfill material supplied to the second region R2. That is, a great amount of underfill materials may be supplied to allow the underfill material layer 107 to be substantially filled between the substrate 101 and the semiconductor device 103 but inventive concepts are not limited thereto. A small amount of underfill materials may be supplied to control the underfill material layer 107 to be formed in a part of an area in which the substrate 101 and the semiconductor device 103 are overlapped.

The underfill material layer 107 may be formed to secure connection reliability between the substrate 101 and the semiconductor device 103. The underfill material layer 107 may be epoxy resin having low viscosity but inventive concepts are not limited thereto. The underfill material layer 107 may include a filler. The filler may reduce mechanical stress between the substrate 101 and the semiconductor device 103. The underfill material layer 107 may be formed to surround the plurality of conductive units 105 formed between the substrate 101 and the semiconductor device 103.

In some embodiments, a sealing member (not shown) sealing the semiconductor device 103 and the underfill material layer 107 while covering an upper surface of the substrate 101 may be further provided on the substrate 101. In such embodiments, the sealing member may be the same material as the underfill material layer 107.

FIGS. 3A and 3C and FIGS. 3B and 3D are plan views and cross-sectional views, respectively, for describing a process of moving an underfill material p107a such as that of FIGS. 2A through 2D according to example embodiments.

Figure 3A:
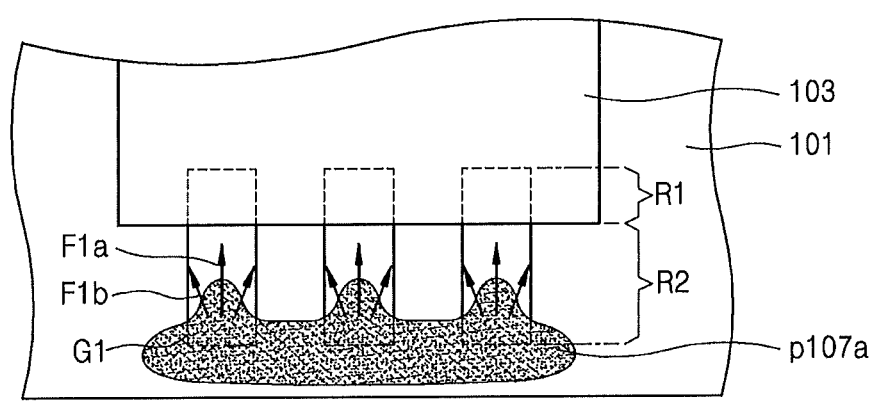
FIGS. 3A through 3D are plan and cross-sectional views for describing a process of moving an underfill material of FIGS. 2A through 2D according to example embodiments.
Figure 3B:
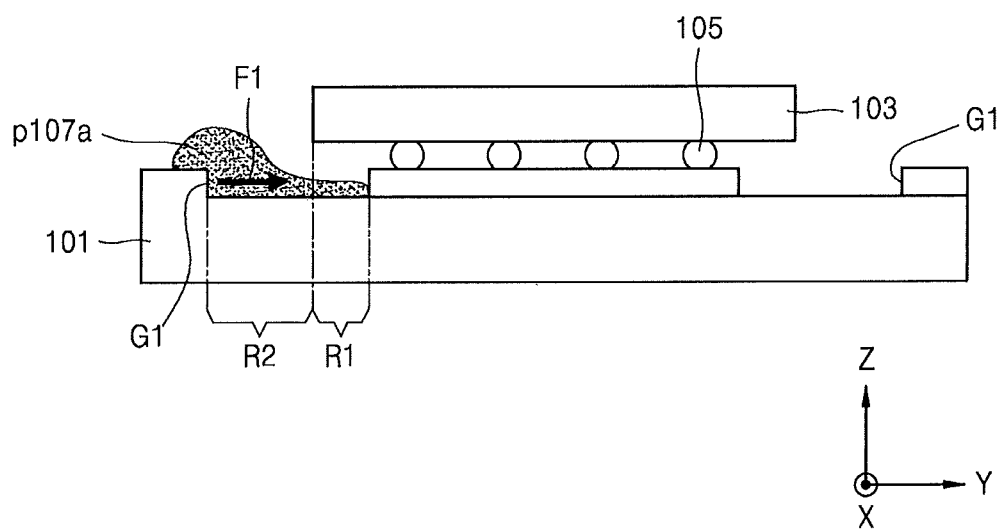

Referring to FIGS. 3A and 3B, the underfill material p107a may be supplied to the second region R2 having an exposed upper surface among the three grooves G1 formed in one side of the semiconductor device 103. The underfill material p107a may be continuously coated on the three grooves G1 but inventive concepts are not limited thereto.

The underfill material p107a may be supplied to the second region R2 and moved along the grooves G1 based on adhesion with inner surfaces of the grooves G1. The underfill material p107a that moved along the grooves G1 may have not only first adhesion F1a with lower surfaces of the grooves G1 but also second adhesion F1b with both sides of the grooves G1. As a result, adhesion F1 between the underfill material p107a and the grooves G1 may be stronger than cohesion of the underfill material p107a itself. That is, in accordance with principles of inventive concepts, the underfill material p107a may be easily moved according to a capillary phenomenon with respect to a difference between the adhesion F1 between the underfill material p107a and the grooves G1 and cohesion of the underfill material p107a itself.

In general, the underfill material p107a moved along the substrate 101 in which the grooves G1 are not present may have only adhesion with a flat surface of the substrate 101. Accordingly, because adhesion between the underfill material p107a and the substrate 101 is weaker than cohesion of the underfill material p107a itself, the underfill material p107a may be difficult to move. Thus, the underfill material p107a may not be filled between the substrate 101 and the semiconductor device 103 and may be hardened in an edge location coated with the underfill material p107a.

Additionally, according to example embodiments, the substrate 101 including the grooves G1 may have not only the first adhesion F1a with lower surfaces of the grooves G1 but also second the adhesion F1b with both sides of the grooves G1, thereby the underfill material p107a easily moves from the second region R2 to the first region R1.

Figure 3C:
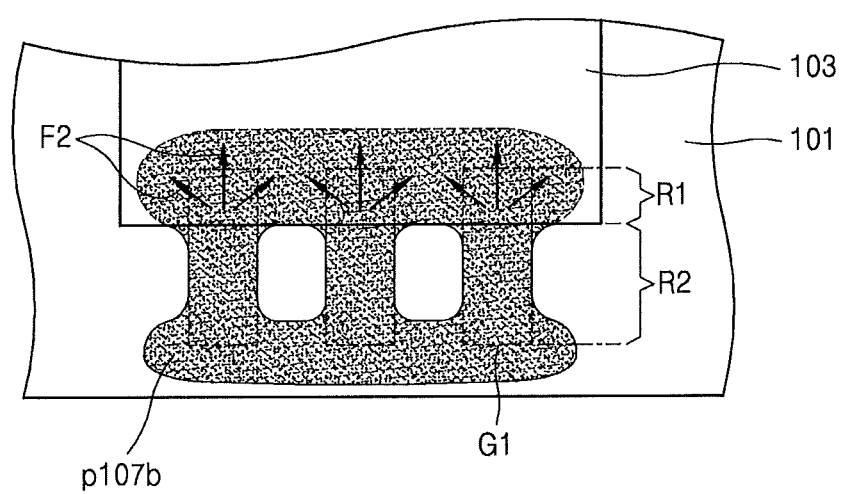
Figure 3D:
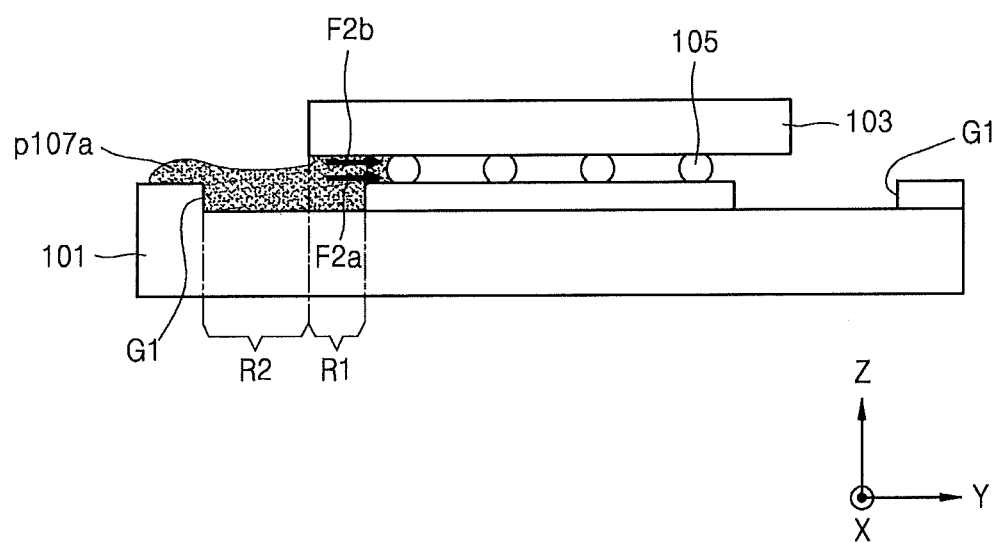

Referring to FIGS. 3C and 3D, the underfill material p107b may be supplied to the second region R2 and moved to the first region R1 based on high adhesion. The underfill material p107b moved to the first region R1 may be introduced between the substrate 101 and the semiconductor device 103.

The underfill material p107b introduced between the substrate 101 and the semiconductor device 103 may be moved to fill between the substrate 101 and the semiconductor device 103 based on first adhesion F2a with the surface of the substrate 101 and second adhesion F2b with the surface of the semiconductor device 103. Adhesion F2 of the underfill material p107b, the substrate 101, and the semiconductor device 103 may be higher than the cohesion of the underfill material p107b itself. As a result, the first region R1 of the grooves G1 is not broadly formed between the substrate 101 and the semiconductor device 103, and, in accordance with principles of inventive concepts, the underfill material p107b may be largely diffused between the substrate 101 and the semiconductor device 103.

That is, in accordance with principles of inventive concepts, the first region R1 of the grooves G1 may function to introduce the underfill material p107b between the substrate 101 and the semiconductor device 103, and, after the underfill material p107b is introduced, the underfill material p107b may be broadly formed according to the capillary phenomenon of the substrate 101 and the semiconductor device 103.

The underfill material p107b may diffuse in a non-directional, or omnidirectional, manner between the substrate 101 and the semiconductor device 103. Accordingly, in accordance with principles of inventive concepts the underfill material p107b may be formed over an entire region in which the substrate 101 and the semiconductor device 103 are overlapped.

Figure 4:
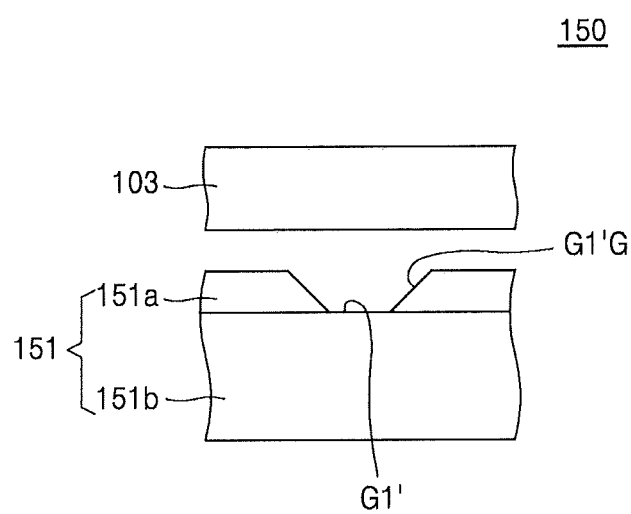
FIG. 4 is a cross-sectional view of a groove in a semiconductor package according to example embodiments.

FIG. 4 is a cross-sectional view of a shape of a groove G1' included in a semiconductor package 150 according to example embodiments. The semiconductor package 150 may be similar to the semiconductor package 100 of FIGS. 1A through 1D except for a shape of the groove G1', for example.

Referring to FIGS. 1D and 4, the semiconductor package 150 may include a substrate 151 including the groove G1' in an upper surface thereof and the semiconductor device 103 mounted on a substrate 151.

The substrate 151 may include a wiring layer 151b and a solder resist layer 151a formed on the wiring layer 151b. The groove G1' may be formed by partially etching the solder resist layer 151a. That is, the groove G1' may be formed by patterning the solder resist layer 151a.

As a result, an inclination may be formed in a side G1'G of the groove G1'. That is, the groove G1' may have a tapered shape from an upper side to a lower side. Accordingly, an underfill material may come in contact with a broader area of an inner surface of the groove G1' and, in accordance with principles of inventive concepts, the underfill material may be more easily introduced between the substrate 151 and the semiconductor device 103.

The groove G1' has the tapered shape from the upper side to the lower side in FIG. 4 but inventive concepts are not limited thereto. The groove G1' may have a tapered shape from the lower side to the upper side. The groove G1' may have a concave or convex shape in a center portion of the side G1'G.

Figure 5:
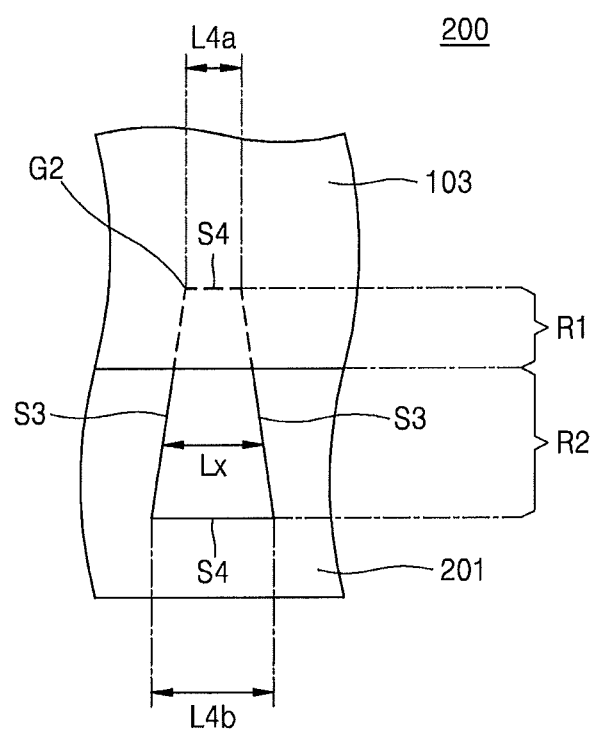
FIGS. 5 and 6 are plan views of grooves in semiconductor packages according to example embodiments.
Figure 6:
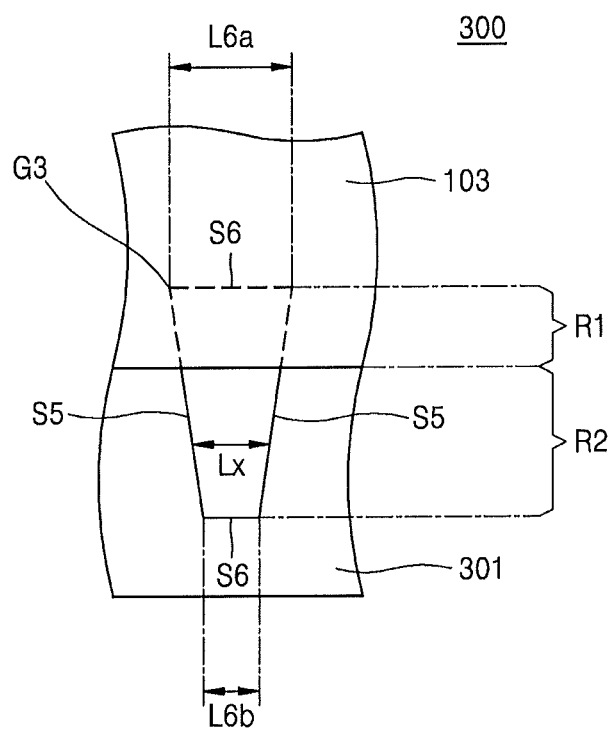

FIGS. 5 and 6 are plan views of shapes of grooves G2 and G3 included in semiconductor packages 200 and 300, respectively, according to example embodiments. The semiconductor packages 200 and 300 may be similar to the semiconductor package 100 of FIGS. 1A through 1D except for the shapes of grooves G2 and G3.

Referring to FIGS. 1B and 5, the semiconductor package 200 may include the substrate 101 including the groove G2 in an upper surface thereof and the semiconductor device 103 mounted on a substrate 101. The groove G2 may have a shape of connecting the first region R1 that is overlapped with the semiconductor device 103 and the second region R2 that is not overlapped with the semiconductor device 103.

The groove G2 may include two first sides S3 divided into the first and second regions R1 and R2 and two second sides S4, each included in one region of the first and second regions R1 and R2. One of the two second sides S4 may be included in the first region R1, and another one may be included in the second region R2.

In example embodiments, the two first sides S3 divided into the first and second regions R1 and R2 may not be parallel to each other. That is, a space Lx between the two first sides S3 may be smaller from the second region R2 to the first region R1. Accordingly, a first length L4a of the second sides S4 included in the first region R1 may be smaller than a second length L4b of the second sides S4 included in the second region R2.

Referring to FIGS. 1D and 6, the groove G3 included in the semiconductor package 300 may include two first sides S5 divided into the first and second regions R1 and R2 and two second sides S6 included in one region of the first and second regions R1 and R2. One of the two second sides S6 may be included in the first region R1, and another one may be included in the second region R2.

The space Lx between the two first sides S5 may be greater from the second region R2 to the first region R1 Accordingly, a first length L6a of the second sides S6 included in the first region R1 may be greater than a second length L6b of the second sides S6 included in the second region R2.

The shapes of the grooves G2 and G3 described with reference to FIGS. 5 and 6 above are example and the example embodiments are not limited thereto. The shapes of the grooves G2 and G3 may be freely selected.

Figure 7:
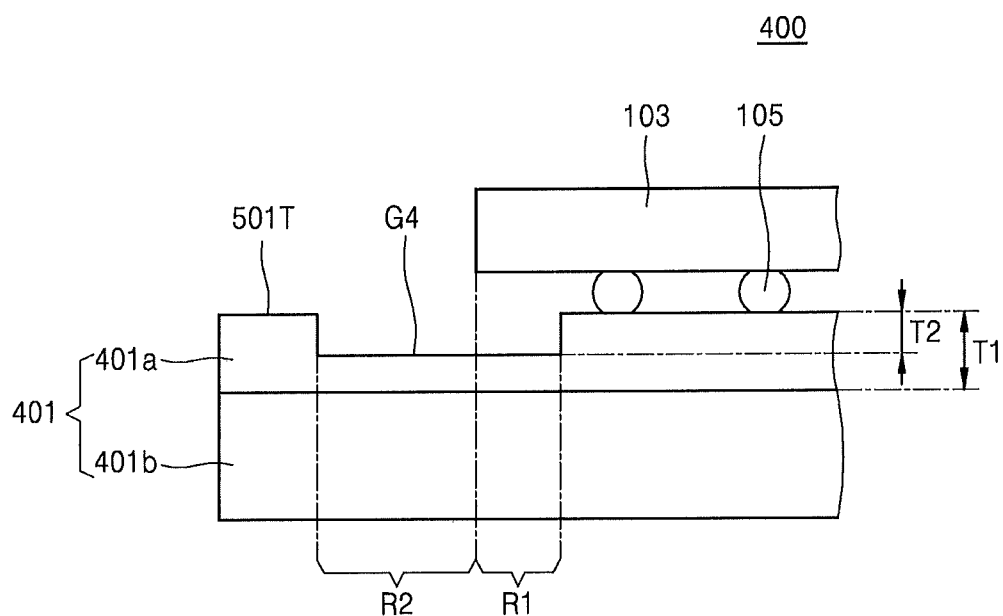
FIGS. 7 and 8 are cross-sectional views of grooves in semiconductor packages according to example embodiments.
Figure 8:
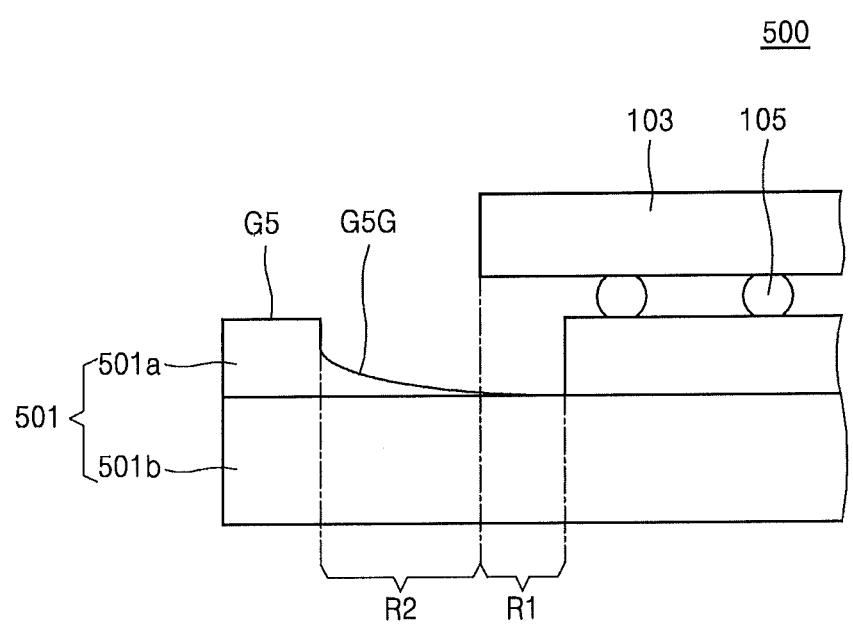

FIGS. 7 and 8 are cross-sectional views of shapes of grooves G4 and G5 included in semiconductor packages 400 and 500 according to example embodiments. The semiconductor packages 400 and 500 may be similar to the semiconductor package 100 of FIGS. 1A through 1D except for the shapes of grooves G4 and G5.

Referring to FIGS. 1C and 7, a substrate 401 may include a wiring layer 401b and a solder resist layer 401a formed on the wiring layer 401b. The groove G4 may be formed by partially etching the solder resist layer 401a. That is, the groove G4 may be formed by patterning the solder resist layer 401a.

In example embodiments in accordance with principles of inventive concepts, only a part of an upper side of the solder resist layer 401a may be patterned. That is, a depth T2 of the groove G4 may be smaller than a thickness T1 of the solder resist layer 401a.

However, as shown in FIGS. 3A and 3B, in addition to the first adhesion F1a of a lower surface of the groove G4 and the underfill material p107a, the second adhesion F1b of side surfaces of the groove G4 and the underfill material p107a may be provided. Thus, the smaller the depth T2 of the groove G4, the lower the second adhesion F1b. That is, in accordance with principles of inventive concepts the depth T2 of the groove G4 may be adjusted in order to control a flow of the underfill material p107a.

Referring to FIG. 8, a substrate 501 may include a wiring layer 501b and a solder resist layer 501a. The groove G5 may be formed by partially etching the solder resist layer 501a. The groove G5 may have a rail shape of connecting the first region R1 that is overlapped with the semiconductor device 103 and the second region R2 that is not overlapped with the semiconductor device 103.

In example embodiments in accordance with principles of inventive concepts, a bottom surface G5G of the groove G4 may have an inclination from the first region R1 to the second region R2. In particular, the bottom surface G5G of the groove G4 may be deepen from the second region R2 to the first region R1. Accordingly, in accordance with principles of inventive concepts an underfill material may be more easily introduced between the substrate 501 and the semiconductor device 103 according to not only adhesion with an inner surface of the groove G5 but also gravity due to the inclination of the bottom surface G5G of the groove G4.

The grooves G4 and G5 are formed in the solder resist layers 401a and 501a in FIGS. 7 and 8 but inventive concepts are not limited thereto. The grooves G4 and G5 may be formed by etching a part of an upper side of the wiring layer 501b. However, in this case, the grooves G4 and G5 are formed in a region in which no wiring pattern is formed.

Figure 9:
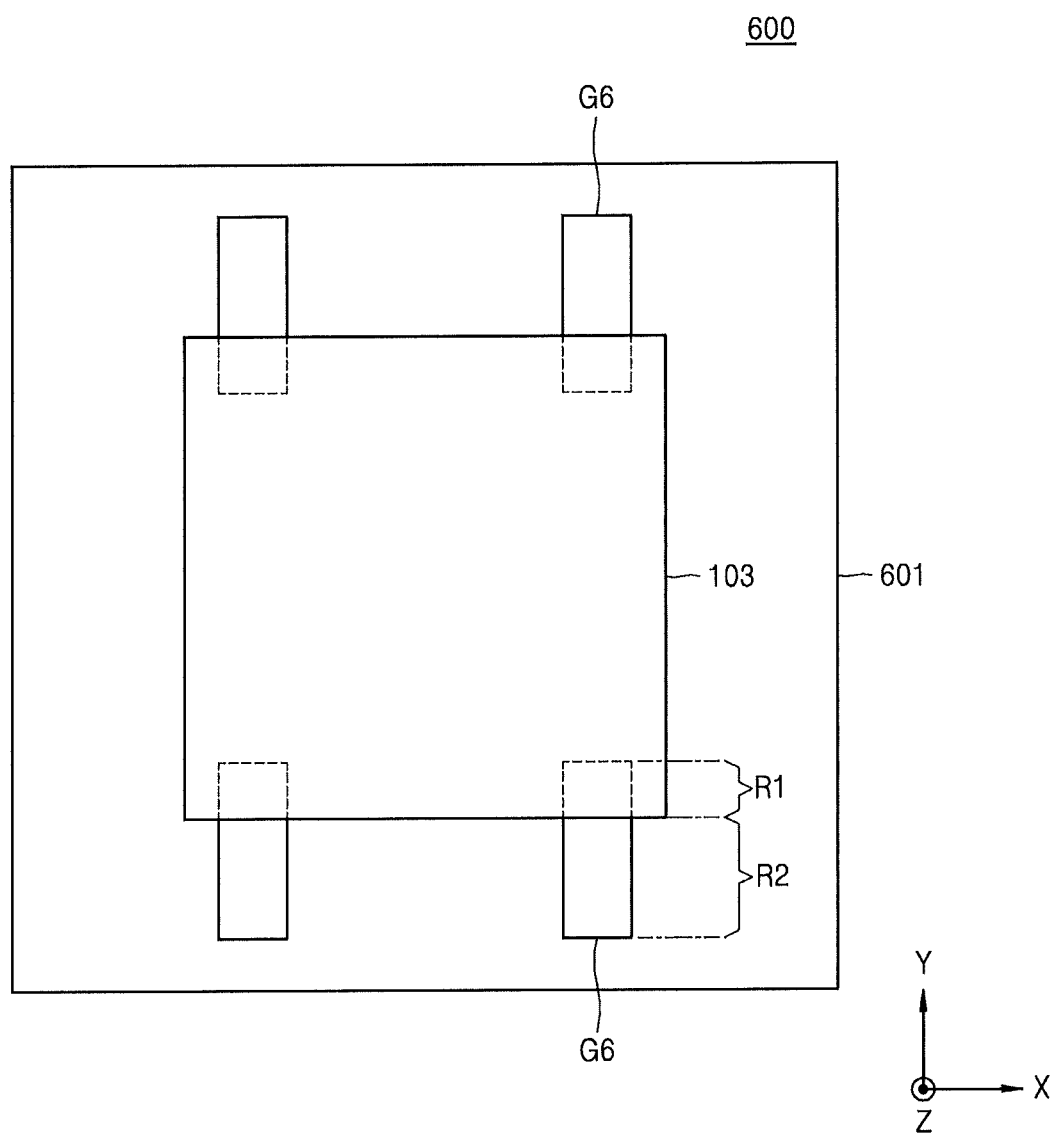
FIGS. 9 through 12 are plan views of layouts of grooves included in semiconductor packages according to example embodiments.

FIG. 9 is a plan view of a layout of grooves G6 included in a semiconductor package 600 according to example embodiments.

Referring to FIG. 9, the semiconductor package 600 may include a substrate 601 including the four grooves G6 and the semiconductor device 103 mounted on the substrate 601. The grooves G6 may have a shape of connecting the first region R1 that is overlapped with the semiconductor device 103 and the second region R2 that is not overlapped with the semiconductor device 103.

The first region R1 of the grooves G6 may be located near each of four apexes of the semiconductor device 103. Accordingly, in accordance with principles of inventive concepts an underfill material supplied through the grooves G6 may be diffused in relation to the four apexes of the semiconductor device 103. In example embodiments in accordance with principles of inventive concepts, the supplied underfill material may be controlled to form an underfill material layer only in a region in which the four apexes of the semiconductor device 103 and the substrate 601 overlap each other. Such an example embodiment will be described with reference to FIGS. 14A and 14B later.

A sufficient amount of underfill material may be supplied to form the underfill material layer 107 as shown in FIGS. 2A through 2D in an entire region between the substrate 601 and the semiconductor device 103.

The substrate 601 may include the grooves G6 of which shapes are described with reference to FIGS. 1A through 1D but inventive concepts are not limited thereto. The grooves G6 may be replaced with a shape of the grooves G2, G3, G4, and G5 described with reference to FIGS. 5 through 8.

Figure 10:
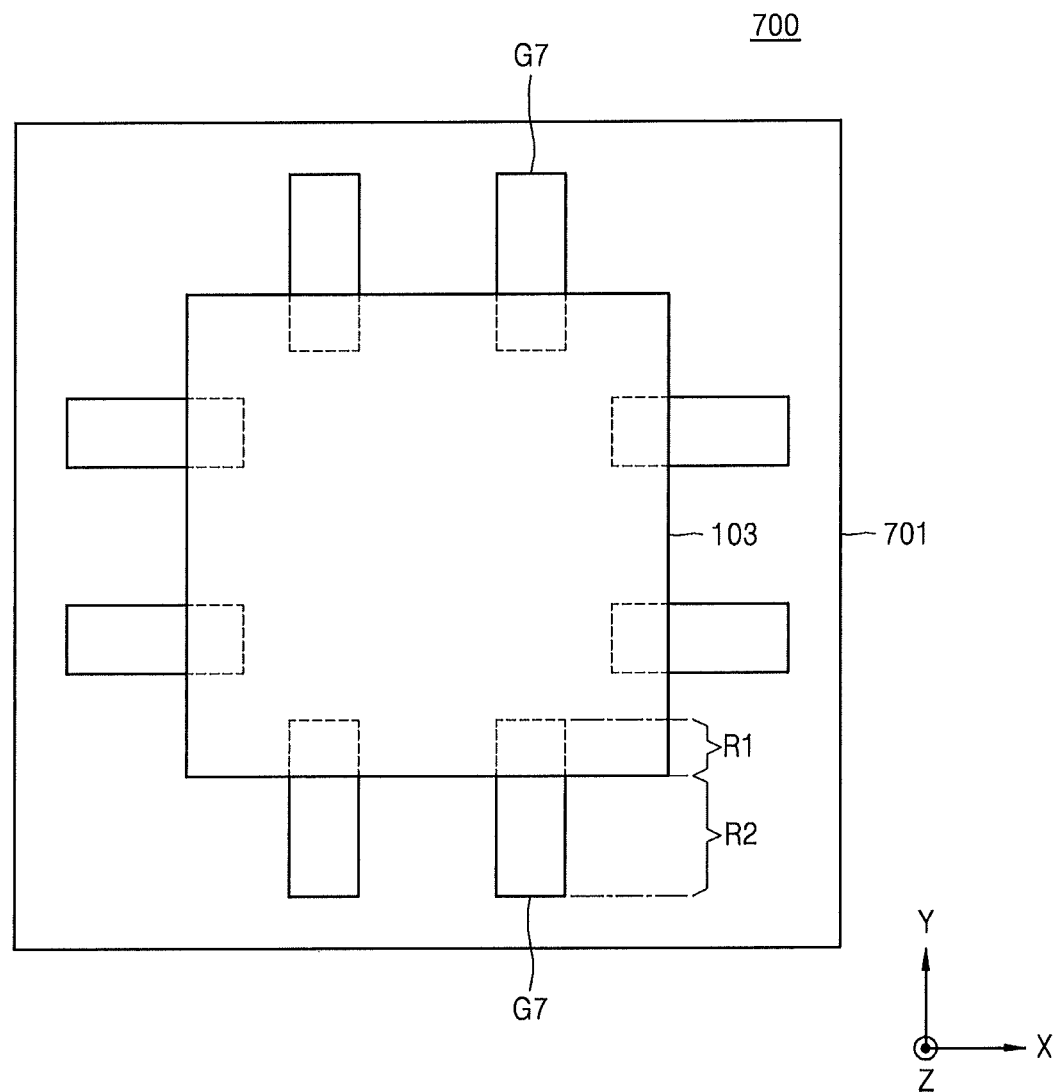

FIG. 10 is a plan view of a layout of grooves G7 included in a semiconductor package 700 according to example embodiments.

Referring to FIG. 10, the grooves G7 included in a substrate 701 of the semiconductor package 700 may be respectively located in regions closer to four sides of the semiconductor device 103. Although eight grooves G7 are illustrated, two of which are located in each of the four sides, the number of the grooves G7 is not limited thereto.

An underfill material supplied through the grooves G7 may be diffused in relation to the four sides of the semiconductor device 103. In accordance with principles of inventive concepts, the supplied underfill material may be controlled to form an underfill material layer only in a region in which the four sides of the semiconductor device 103 and the substrate 701 overlap each other. However, a sufficient amount of underfill material may be supplied to form the underfill material layer 107 as shown in FIGS. 2A through 2D in an entire region between the substrate 701 and the semiconductor device 103.

Figure 11:
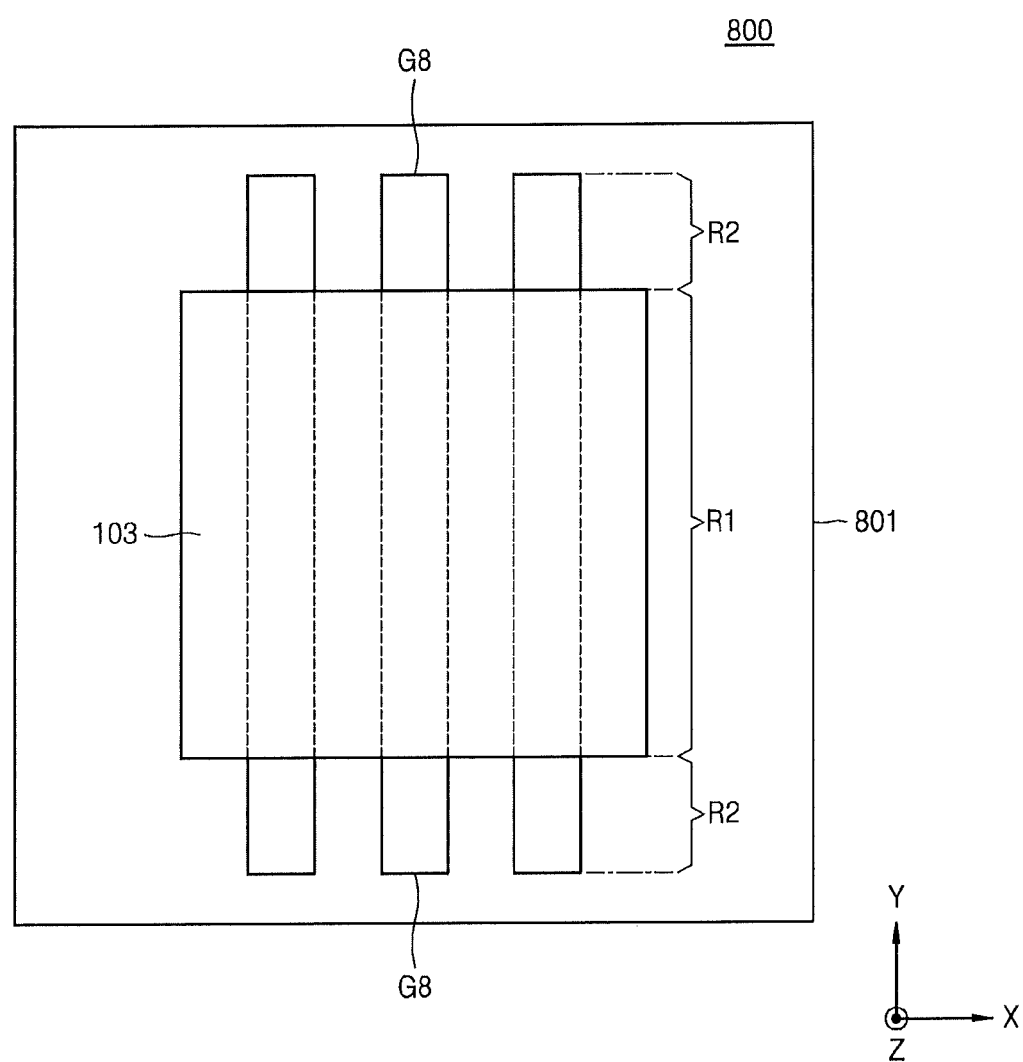

FIG. 11 is a plan view of a layout of grooves G8 included in a semiconductor package 800 according to example embodiments.

Referring to FIG. 11, the grooves G8 included in a substrate 801 of the semiconductor package 800 may extend across the semiconductor device 103. Accordingly, the grooves G8 may extend from a region that is not overlapped with the semiconductor device 103 to form the second region R2 and may extend across a region that is overlapped with the semiconductor device 103 to form the first region R1. In accordance with principles of inventive concepts, the grooves G8 may not end in the first region R1 but may further extend to the region that is not overlapped with the semiconductor device 103 and form the additional second region R2. That is, the grooves G8 may include two first sides divided into the first and second regions R1 and R2 and two second sides included in the second region R2.

An underfill material may be supplied through the second region R2 of the grooves G8. In this regard, the underfill material may be supplied through one of the two second regions R2 located at both ends of the first region R1, whereas the underfill material may be supplied through the two second regions R2.

In accordance with principles of inventive concepts, underfill material supplied through the second regions R2 of the grooves G8 may be induced to the first region R1 according to adhesion of inner surfaces of the grooves G8. The underfill material may be moved in the first region R1 according to the adhesion of inner surfaces of the grooves G8 and adhesion of the substrate 801 and the semiconductor device 103. Accordingly, the underfill material layer 107 as shown in FIGS. 2A through 2D may be formed in an entire region between the substrate 801 and the semiconductor device 103.

The three grooves G8 that extend in parallel to each other are illustrated but the number of the grooves G8 is not limited thereto.

Figure 12:
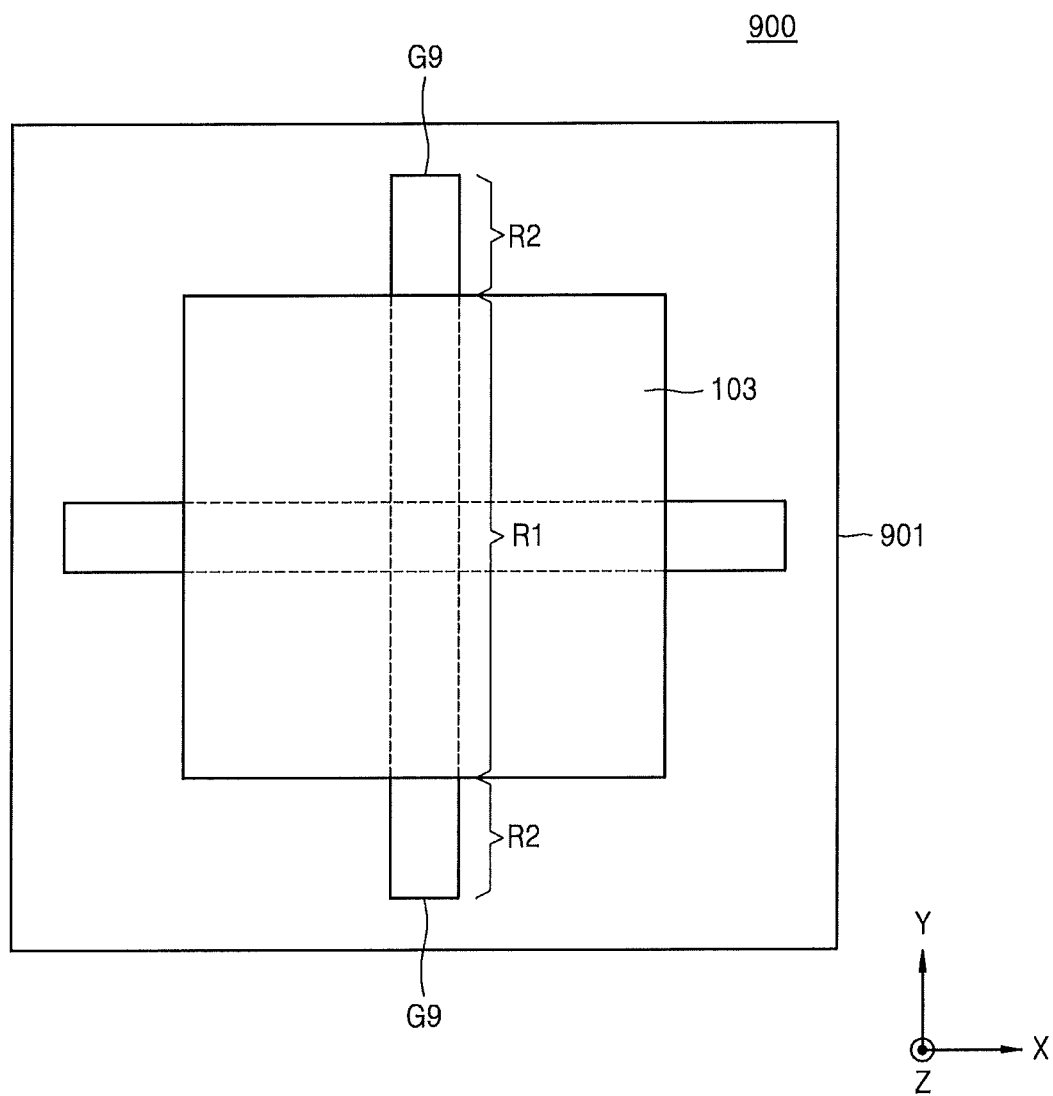

FIG. 12 is a plan view of a layout of grooves G9 included in a semiconductor package 900 according to example embodiments.

Referring to FIG. 12, the two grooves G9 included in a substrate 901 of the semiconductor package 900 may cross each other to extend across the semiconductor device 103. An underfill material may be supplied through the two grooves G9 that cross each other. Accordingly, the underfill material layer 107 as shown in FIGS. 2A through 2D may be formed in an entire region between the substrate 901 and the semiconductor device 103.

The layouts of the grooves G1, G6, G7, G8, and G9 are exemplarily illustrated in FIGS. 1A through 1D and FIGS. 9 through 12, but inventive concepts are not limited thereto. A layout of grooves on a substrate may be freely selected. An amount of an underfill material supplied to the grooves may be regulated to control a range of an underfill material layer.

Figure 13A:
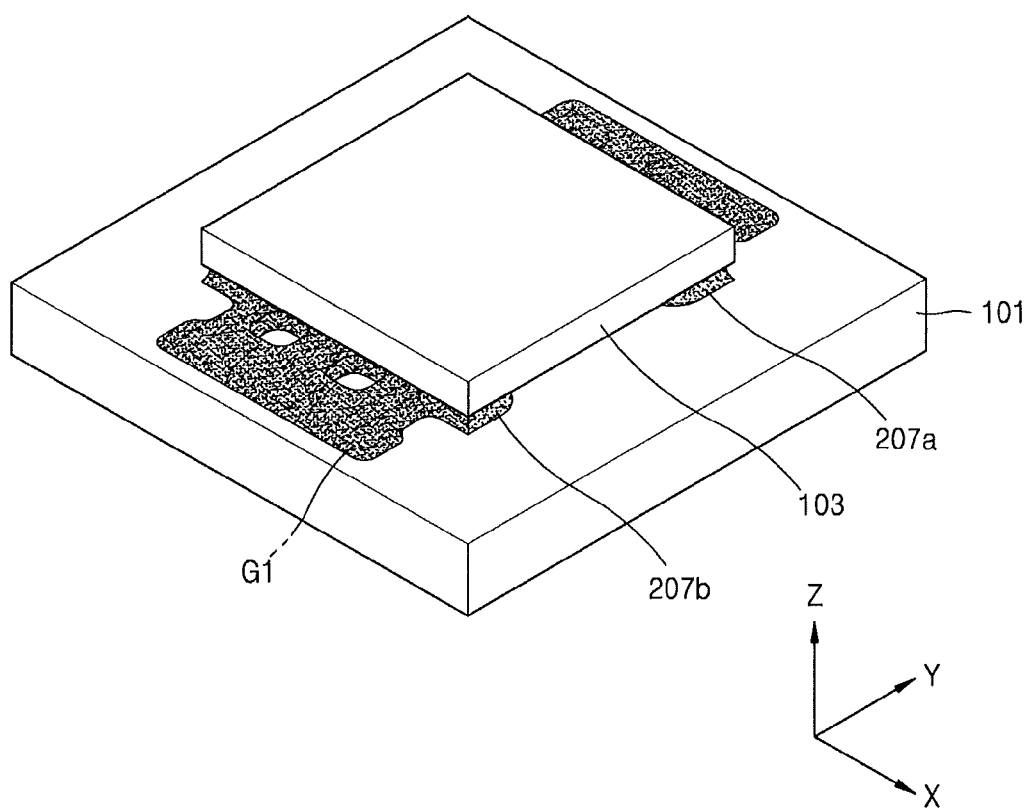
FIGS. 13A through 13C are perspective, plan, and cross-sectional views of a semiconductor package according to example embodiments.
Figure 13B:
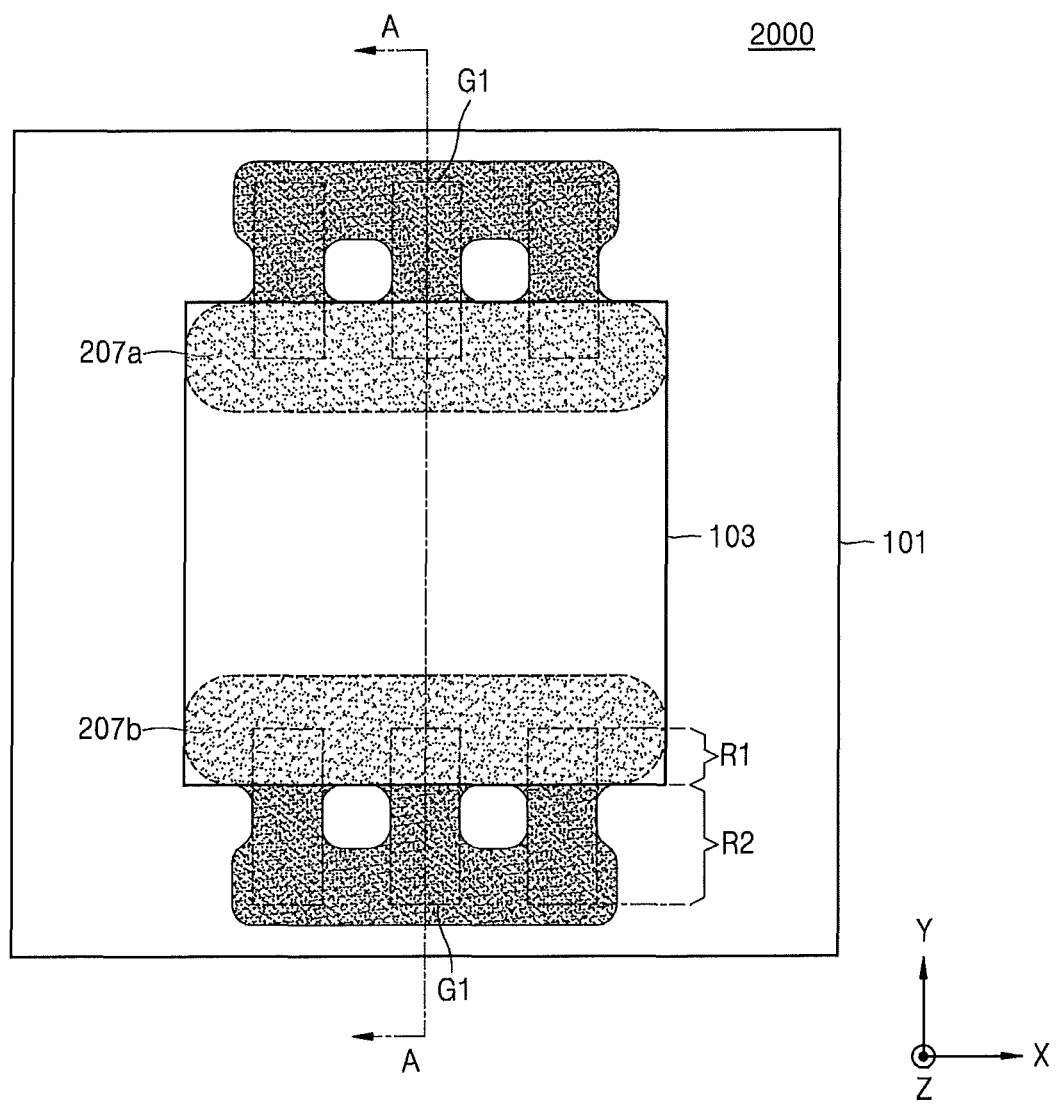
Figure 13C:
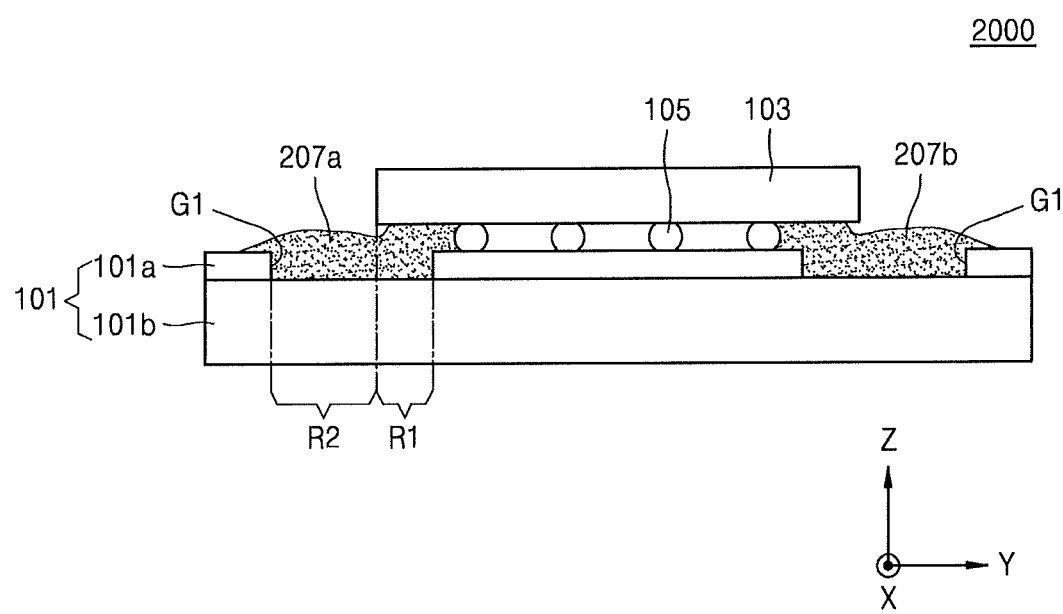

FIGS. 13A through 13C are perspective, plan, and cross-sectional views of a semiconductor package 2000 according to example embodiments. The semiconductor package 2000 is similar to the semiconductor package 1000 described with reference to FIGS. 2A through 2D except for a range of underfill material layers 207a and 207b.

Referring to FIGS. 13A through 13C, the underfill material layers 207a and 207b filled in the grooves G1 of the substrate 101 included in the semiconductor package 2000 may not be formed in an entire region between the substrate 101 and the semiconductor device 103 but may be formed only in a part of the entire region.

Six grooves G1 may be formed in total, three of which may be formed in each side of the semiconductor device 103. An underfill material may be supplied to the second region R2 of the grooves G1 having exposed upper surfaces. The supplied underfill material may be filled in the grooves G1 up to the first region R1 overlapped with the semiconductor device 103 based on adhesion with inner surfaces of the grooves G1. The underfill material introduced between the substrate 101 and the semiconductor device 103 may be filled between the substrate 101 and the semiconductor device 103 based on adhesion with a surface of the substrate 101 and adhesion with a surface of the semiconductor device 103. In accordance with principles of inventive concepts, a small amount of underfill material may be supplied to partially form the underfill material layers 207a and 207b in both sides of the semiconductor device 103 closer to the grooves G1. In such example embodiments, the conductive bonding units 105 that connect the substrate 101 and the semiconductor device 103 may not be shielded by the underfill material layers 207a and 207b.

Figure 14A:
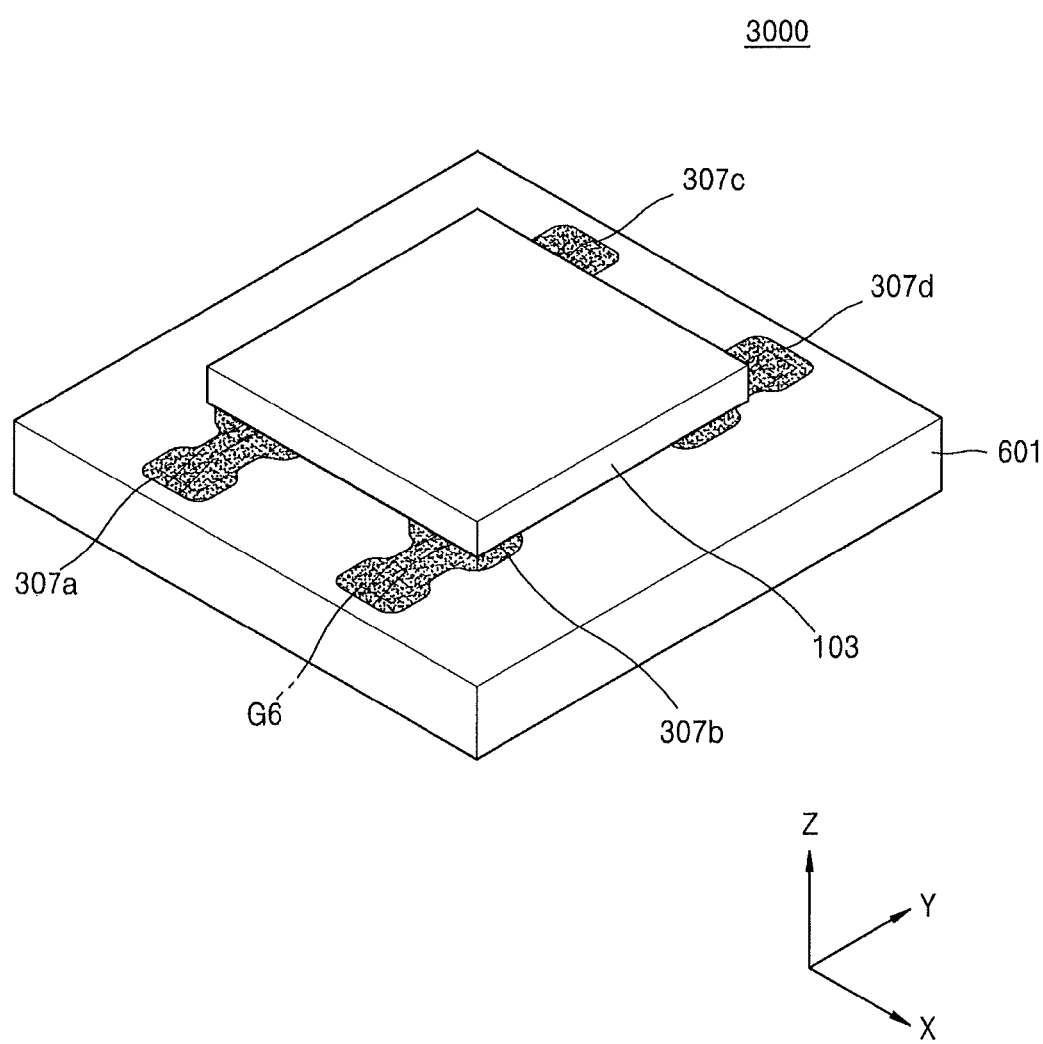
FIGS. 14A and 14B are perspective and plan views of a semiconductor package according to example embodiments.
Figure 14B:
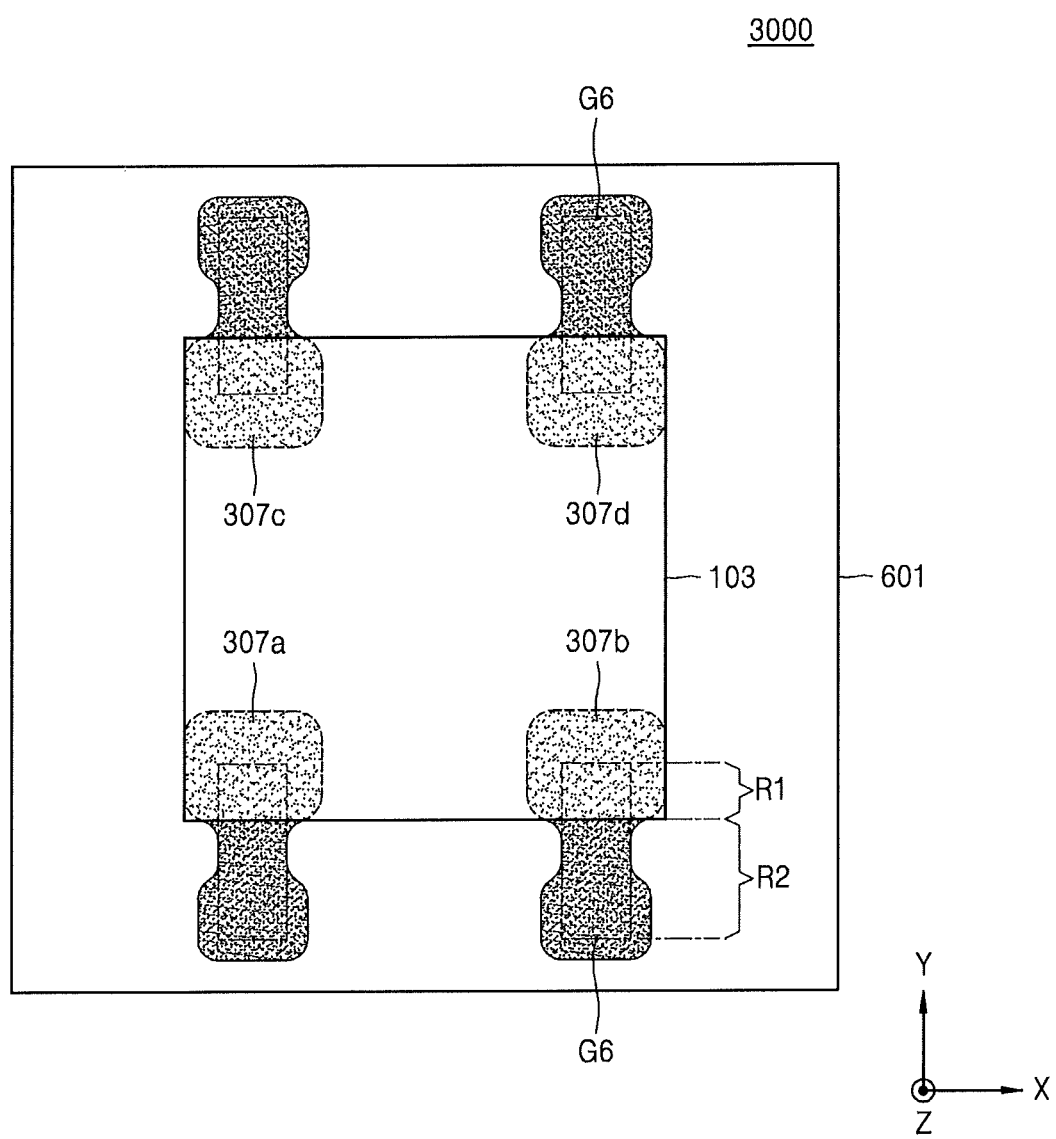

FIGS. 14A and 14B are perspective and plan views of a semiconductor package 3000 according to example embodiments. The semiconductor package 3000 is similar to the semiconductor package 1000 described with reference to FIGS. 2A through 2D except for a range of underfill material layers 307a, 307b, 307c, and 307d.

Referring to FIGS. 14A and 14B, the semiconductor package 3000 may include the plurality of underfill material layers 307a, 307b, 307c, and 307d that are formed in the grooves G6 of the substrate 601 and are formed between the substrate 601 and the semiconductor device 103. As described with reference to FIG. 9 above, the substrate 601 may include the four grooves G6 introduced into four apexes. The four grooves G6 may be respectively filled with the plurality of underfill material layers 307a, 307b, 307c, and 307d.

An underfill material introduced into the second region R2 of the four grooves G6 may be introduced between the substrate 601 and the semiconductor device 103 based on adhesion with inner surfaces of the grooves G6. In accordance with principles of inventive concepts, an amount of supplied underfill material may be controlled to respectively form the underfill material layers 307a, 307b, 307c, and 307d in four apex regions between the substrate 601 and the semiconductor device 103.

As described above, the semiconductor packages 100, 150, 200, 300, 400, 500, 600, 700, 800, 900, 1000, 2000, and 3000 according to the example embodiments may include grooves extending from a region having an exposed upper surface to a region hidden, or covered, by a semiconductor device in or on a substrate. Accordingly, if an underfill material is supplied to the region having the exposed upper surface among the grooves, the underfill material may be easily moved, or dispersed, between the substrate and the semiconductor device based on adhesion with inner surfaces of the grooves. In this manner, in accordance with principles of inventive concepts an underfill material layer may be easily filled between the substrate and the semiconductor device although a component of the underfill material is not changed.

While inventive concepts have been particularly shown and described with reference to example embodiments thereof, it will be understood that various changes in form and details may be made therein without departing from the spirit and scope of inventive concepts.

What is claimed is:

1. A semiconductor package comprising:
a substrate having at least one groove formed in a solder resist layer on a top surface of the substrate to expose an underlying printed circuit board; and
a semiconductor device mounted on the substrate,
wherein the at least one groove includes long and short sides and has a shape including a first region and second region that are connected to each other, wherein the first region is covered by the semiconductor device and the second region is uncovered by the semiconductor device, wherein one of the short sides is included in the first region and one of the short sides is included in the second region and an underfill material fills the groove.

2. The semiconductor package of claim 1, further comprising:
an underfill material layer filling the first region and the second region and formed between the substrate and the semiconductor device.

3. The semiconductor package of claim 2, wherein the underfill material layer is fully filled between the substrate and the semiconductor device.

4. The semiconductor package of claim 2, wherein the underfill material layer comprises:
a plurality of underfill members spaced apart from each other,
wherein a plurality of grooves are respectively filled by the plurality of underfill members.

5. The semiconductor package of claim 1, wherein the at least one groove comprises two first sides divided into the first region and the second region and two second sides, each included in one of the first region and the second region,
wherein the first sides are longer than the second sides.

6. The semiconductor package of claim 5, wherein one of the two second sides is in the second region and the other one is in the first region.

7. The semiconductor package of claim 5, wherein the two second sides are parallel to each other in the second region.

8. The semiconductor package of claim 5, wherein the second sides are equal to or less than one half a length of the first sides.

9. The semiconductor package of claim 5, wherein the two first sides are not parallel to each other.

10. The semiconductor package of claim 5, wherein a space between the two first sides tapers from the second region to the first region.

11. The semiconductor package of claim 1, wherein lower or side surfaces of the groove are inclined.

12. The semiconductor package of claim 11, wherein the lower surfaces of the groove are deeper in the second region than in the first region.

13. The semiconductor package of claim 1, wherein the substrate comprises a wiring layer and a solder resist layer,
wherein the groove are formed by etching a part of the solder resist layer.

14. A semiconductor package comprising:
a substrate having at least one groove in an upper surface, the groove including long sides and short sides;
a semiconductor device mounted on the substrate and exposing a portion of the groove and covering the remaining portion of the groove, with one short side of the groove covered by the semiconductor device and another short side of the groove exposed; and
an underfill material layer filling the exposed portion and the remaining portion of the groove and formed between the substrate and the semiconductor device.

15. The semiconductor package of claim 14, wherein a part of the underfill material layer that fills the exposed portion and the remaining portion of the groove and another part formed between the substrate and the semiconductor device are integrally formed with each other.

16. A semiconductor package, comprising:
a substrate including a printed circuit board and a solder resist layer coated on a top surface thereof;
a groove including two short sides and two longs sides formed in the solder resist layer to enhance flow of underfill material with which the groove is filled under a semiconductor device; and
a semiconductor device mounted on the top surface of the substrate, leaving a portion of the groove exposed.

17. The semiconductor package of claim 16, further comprising an underfill material between the semiconductor device and substrate and at least partially filling the groove.

18. The semiconductor package of claim 17, wherein the semiconductor device includes a second semiconductor package.

19. The semiconductor package of claim 17 wherein the underfill material is in areas between the semiconductor device and the substrate in addition to that in the groove.

20. The semiconductor package of claim 17, wherein the groove is narrower under the semiconductor device than outside a boundary of the semiconductor device.

* * * * *